United States Patent
Tamezane et al.

(10) Patent No.: US 7,471,067 B2
(45) Date of Patent: Dec. 30, 2008

(54) BATTERY REMAINING CAPACITY DETECTION METHOD AND POWER SUPPLY APPARATUS

(75) Inventors: Shigeto Tamezane, Kakogawa (JP); Kenshi Matsumoto, Kasai (JP)

(73) Assignee: Sanyo Electric Co., Ltd., Osaka (JP)

( * ) Notice: Subject to any disclaimer, the term of this patent is extended or adjusted under 35 U.S.C. 154(b) by 250 days.

(21) Appl. No.: 11/328,308

(22) Filed: Jan. 10, 2006

(65) Prior Publication Data

US 2006/0158155 A1 Jul. 20, 2006

(30) Foreign Application Priority Data

Jan. 14, 2005 (JP) ............... 2005-008115

(51) Int. Cl.
*H02J 7/00* (2006.01)
*H02J 7/04* (2006.01)
(52) U.S. Cl. .............. 320/132; 320/129; 320/130; 320/135; 320/149
(58) Field of Classification Search .......... 320/129, 320/132, 149, 130, 135
See application file for complete search history.

(56) References Cited

U.S. PATENT DOCUMENTS

| | | | |
|---|---|---|---|
| 6,417,646 B1 * | 7/2002 | Huykman et al. | 320/122 |
| 6,515,452 B2 * | 2/2003 | Choo | 320/132 |
| 6,700,383 B2 * | 3/2004 | Kimura et al. | 324/429 |
| 7,078,907 B2 * | 7/2006 | Uesaka et al. | 324/429 |
| 2006/0022643 A1 * | 2/2006 | Brost et al. | 320/132 |

FOREIGN PATENT DOCUMENTS

JP  56-126776  10/1981

* cited by examiner

*Primary Examiner*—Akm E Ullah
*Assistant Examiner*—Johali A Torres Ruiz
(74) *Attorney, Agent, or Firm*—Wenderoth, Lind & Ponack, L.L.P.

(57) ABSTRACT

A battery remaining capacity detection method calculates a remaining capacity of a battery having the possibility that a memory effect occurs by using correlation between an voltage $V_0$ and the remaining capacity. Correlation between a reset voltage $V_{o\ reset}$ that is obtained by subtracting a value obtained by multiplying an occurrence amount $V_m$ based on the memory effect by a memory effect occurrence amount correction value C(SOC) from an initial voltage $V_{o\ ini}$ and the remaining capacity is obtained, in the battery after use, based on correlation between the initial voltage $V_{o\ ini}$ and the remaining capacity. The remaining capacity is obtained by setting the voltage $V_0$ of the battery after use as the reset voltage $V_{0\ reset}$. This method provides precise battery detection without completely discharging.

5 Claims, 6 Drawing Sheets

BATTERY REMAINING CAPACITY DETECTION METHOD AND POWER SUPPLY APPARATUS

BACKGROUND OF THE INVENTION

1. Field of the Invention

The present invention relates to a battery remaining capacity detection method and a power supply apparatus, and more particularly to a remaining capacity detection method and a power supply apparatus that detect a remaining capacity of a battery contained in a power supply apparatus for driving a motor for running vehicles, for example.

2. Description of the Related Art

A battery remaining capacity (state-of-charge (SOC) is typically detected by subtracting a discharge amount from a full-charged state. The discharge amount is calculated by integrating a discharge current. The battery remaining capacity is displayed as the product of current and time, i.e., Ah, or as the rate (%) relative to the full-charged capacity defined as 100% that is an amount (Ah) when a battery is fully charged. In either display state of remaining capacity, it is detected by subtracting a discharged amount from the full-charged state. However, the remaining capacity that is detected based on the integrated value of discharged current does not always agree with a correct remaining capacity of battery. The reason is that the amount of current or temperature causes an error of remaining capacity detection.

A method disclosed in Japanese Laid-Open Patent Publication TOKUKAI No. SHO 56-126776 has been developed to provide an amount detection method that precisely detects the amount of battery for vehicles even in the operation of vehicles. In this method, battery discharge current values at a plurality of different times when different values are obtained in the discharging with a large amount of current, and battery voltage terminal values when the respective currents are discharged are detected. The internal resistance and the voltage of the battery are calculated based on the detected current and voltage value. The battery capacity is calculated based on the calculated internal resistance and voltage by using a function that represents correlation among a previously and experimentally obtained battery capacity and an internal resistance and an voltage.

However, in some batteries used for power supply, a memory effect occurs, and thus may cause difficulty of remaining capacity detection. The memory effect is a phenomenon where, in the case where a nickel-cadmium battery, nickel-hydrogen battery or the like is cyclically charge/discharged from/to a shallow depth of discharge, its discharge voltage temporarily decreases when discharged to a deep depth of discharge. Since the remaining capacity of battery varies due to a memory effect, the remaining capacity of battery cannot be precisely estimated. If the remaining capacity is improperly detected, the battery may have an overload in charging/discharging operation. This may cause remarkable deterioration of battery life.

On the other hand, the remaining capacity varies due to battery self discharging. These factors cause difficulty of estimation of battery remaining capacity. For this reason, it is very difficult to precisely ascertain the remaining capacity.

The present invention is aimed at solving the problems. It is a main object of the present invention is to provide a battery remaining capacity detection method and a power supply apparatus capable of more precisely detecting a battery remaining capacity.

SUMMARY OF THE INVENTION

In order to achieve the above object, a battery remaining capacity detection method according to a first aspect of the present invention is a battery remaining capacity detection method that calculates a remaining capacity of a battery having the possibility that a memory effect occurs by using a correlation between a voltage $V_0$ and the remaining capacity comprising steps of: obtaining a correlation between a reset voltage $V_{o\ reset}$ (that is obtained by subtracting a value obtained by multiplying an occurrence amount $V_m$ based on the memory effect by a memory effect occurrence amount correction value C(SOC) from an initial voltage $V_{o\ ini}$)and the remaining capacity, in the battery after use, based on a correlation between the initial voltage $V_{o\ ini}$ and the remaining capacity; and obtaining the remaining capacity by setting the voltage $V_0$ of the battery after use as the reset voltage $V_{0\ reset}$. This method provides precise battery detection without completely discharging.

Furthermore, in a battery remaining capacity detection method according to a second aspect of the present invention, the memory effect occurrence amount correction value C(SOC) is a value correlating to a remaining capacity that is used in a battery operation state before calculation. Accordingly, an integrated remaining capacity that is integrated in operation of a connection device can be corrected to a more precise estimated remaining battery. Therefore, it is possible to precisely detect the remaining capacity.

Still furthermore, in a battery remaining capacity detection method according to a third aspect of the present invention, the memory effect occurrence amount correction value C(SOC) is controlled such that, in the case where the remaining capacity used in the battery operation state falls within a range where the memory effect is large, it approaches 1, and, in the case where the remaining capacity used in the battery operation state falls within a range where the memory effect is small, it approaches zero.

Still furthermore, in a battery remaining capacity detection method according to a fourth aspect of the present invention, the occurrence amount $V_m$ based on the memory effect has a positive correlation with a value obtained by integrating a value obtained by multiplying a charging or discharging current value, a correction coefficient relating to battery deterioration, and a correction coefficient corresponding to a battery temperature at a prescribed period, and the correction coefficient corresponding to a battery temperature has a positive correlation with the battery temperature. The correction coefficient relating to battery deterioration is a value that has a positive correlation with a value obtained by integrating a value obtained by multiplying a charging or discharging current value, and a correction coefficient corresponding to a second battery temperature at a prescribed period, and the correction coefficient corresponding to a second battery temperature has a positive correlation with the battery temperature.

Still furthermore, in a battery remaining capacity detection method according to a fifth aspect of the present invention, a value obtained by multiplying the occurrence amount $V_m$ based on the memory effect in the electromotive $V_0$ and the memory effect occurrence amount correction value C(SOC) is compared with a voltage reduction difference $V_{ms}$ corresponding to a self discharging amount in the electromotive $V_0$, when the voltage reduction difference $V_{ms}$ corresponding to a self discharging amount is larger, correlation between a second rest voltage $V_{o\ reset}$ obtained by subtracting the voltage reduction difference $V_{ms}$ corresponding to a self discharging amount from the initial voltage $V_{o\ ini}$ and the remaining capacity is obtained, in the battery after use, based on correlation between the initial voltage $V_{o\ ini}$ and the remaining capacity, and the remaining capacity is obtained by setting the voltage $V_o$ of the battery after use as the second rest voltage $V_{o\ reset}$.

Still furthermore, a battery remaining capacity detection method, according to a sixth aspect of the present invention, that detects a battery remaining capacity when power is supplied from a battery contained in a power supply apparatus to a connection device that is connected to the power supply apparatus comprises steps of detecting an integrated remaining capacity by detecting and integrating a charging/discharging current and/or a charging/discharging voltage applied to the connection device in operation of the connection device; calculating a battery internal resistance and an initial voltage from the discharging current and the discharging voltage by detecting the discharging current, the discharging voltage and a battery temperature by repeating pulse discharging a plurality of times not in operation of the connection device; estimating the battery remaining capacity based on the calculated battery internal resistance and initial voltage, and the detected battery temperature by referring to a previously prepared voltage table of initial voltage $V_{o\ ini}$ or reset initial voltage $V_{o\ reset}$. In this case, since calculation is performed in a plurality of times of pulse discharging, it is possible to improve calculation precision. In addition, since repeating pulse discharging a plurality of times can provide an effect that brings remaining capacity hysteresis constant, it is possible to provide high precise calculation in from this point of view.

Still furthermore, in a battery remaining capacity detection method according to a fifth aspect of the present invention, the method further comprising a step of correcting the integrated remaining capacity based on the estimated remaining capacity.

Still furthermore, in a battery remaining capacity detection method according to an eighth aspect of the present invention, filtering is performed in calculation of the battery internal resistance and the initial voltage by repeating pulse discharging a plurality of times.

Still furthermore, in a battery remaining capacity detection method according to a ninth aspect of the present invention, the connection device is a motor for a vehicle, and the remaining capacity of the battery included in the power supply apparatus that drives the motor for vehicle is detected. In this case, this method is suitably applied to a battery remaining capacity detection in a power supply apparatus for a vehicle.

Moreover, a power supply apparatus according to the present invention comprises a battery unit including a plurality of rechargeable batteries; a voltage detection portion that detects a voltage of the rechargeable batteries included the battery unit; a temperature detection portion that detects a temperature of the rechargeable batteries included the battery unit; a current detection portion that detects a current applied to the rechargeable batteries included the battery unit; a remaining capacity calculation portion that detects a remaining capacity of the rechargeable batteries based on a calculation performed on signals input from the voltage, temperature and current detection portions; and a communication processing portion that transmits the remaining capacity calculated by the remaining capacity calculation portion to a connection device. In operation of the connection device, the voltage detection portion and/or the current detection portion detects a charging/discharging current and/or a charging/discharging voltage applied to the connection device, and the remaining capacity calculation portion integrates the charging/discharging current and/or the charging/discharging voltage and thus detects an integrated remaining capacity. Not in operation of the connection device, the remaining capacity calculation portion repeats pulse discharging a plurality of times, calculates a battery internal resistance and an initial voltage from the discharging current and/or the discharging voltage that is detected by the voltage detection portion and/or the current detection portion. The remaining capacity calculation portion estimates the remaining capacity of the battery based on the calculated battery internal resistance and initial voltage by referring to a previously prepared voltage table. This construction provides precise battery detection without completely discharging.

The battery remaining capacity detection method and power supply apparatus according to the present invention have an excellent feature that can precisely detect battery remaining capacity irrespective of an occurrence state of memory effect. Particularly, variation of remaining capacity due to memory effect occurrence is predicted by using the table in consideration of battery temperature, and so on. The calculation method based on empirical values with reference to the table can ensure relatively precise detection of battery remaining capacity at each time with simple construction. In addition, according to this method, it is possible to detect the remaining capacity in consideration not only of memory effect but also of error due to self discharging.

The above and further objects and features of the invention will more fully be apparent from the following detailed description with accompanying drawings.

DETAILED DESCRIPTION OF THE INVENTION

Figure 1:
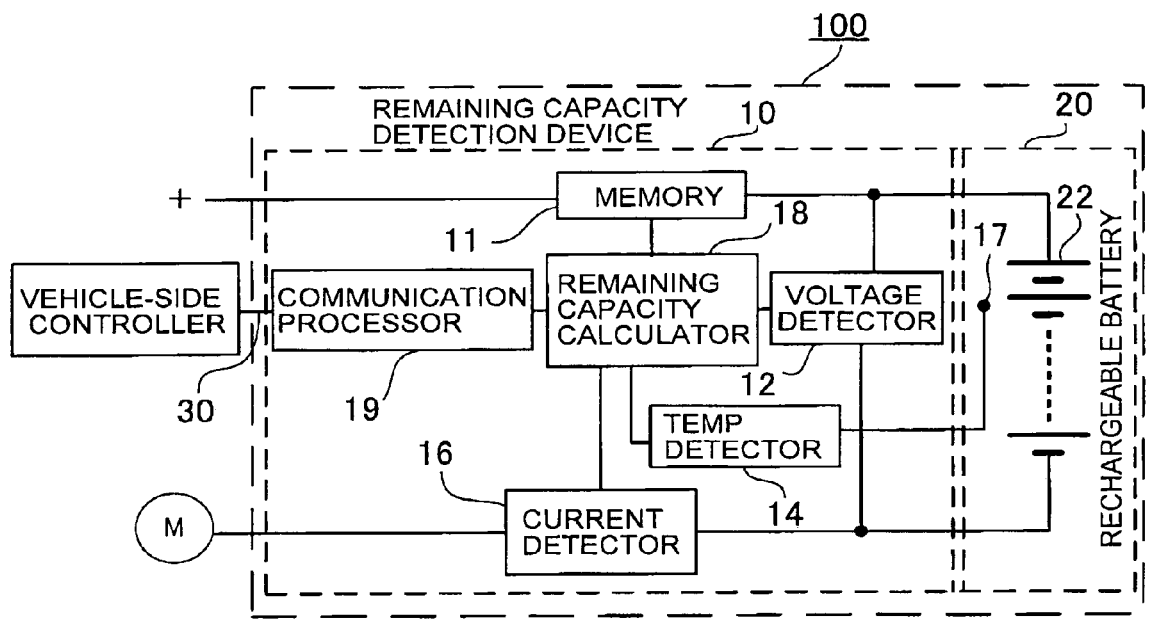
FIG. 1 is a block diagram showing the construction of a power supply apparatus according to one embodiment of the present invention.

The following description will describe embodiments according to the present invention with reference to the drawings. It should be appreciated, however, that the embodiments described below are illustrations of a battery remaining capacity detection method and a power supply apparatus to give a concrete form to technical ideas of the invention, and a battery remaining capacity detection method and a power supply apparatus of the invention are not specifically limited to description below. Furthermore, it should be appreciated that the elements recited in claims attached hereto are not meant to be an exhaustive representation of the elements of all the embodiments. Additionally, the sizes and the arrangement relationships of the elements in each of drawings are occasionally shown larger exaggeratingly for ease of explanation. The same or similar elements in the drawings have the same designation and the same reference numerals and their description is omitted. In addition, a plurality of structural elements of the present invention may be configured as a single part which serves the purpose of a plurality of elements, on the other hand, a single structural element may be configured as a plurality of parts which serve the purpose of a single element.

(Power Supply Apparatus 100)

FIG. 1 is a block diagram showing the construction of a power supply apparatus according to one embodiment of the present invention. The power supply apparatus 100 shown in this figure includes a battery unit 20 containing rechargeable batteries 22, and a remaining capacity detection device 10. The remaining capacity detection device 10 includes a voltage detection portion 12 that detects a battery voltage; a temperature detection portion 14 that detects a battery temperature; a current detection portion 16 that detects a current applied to the batteries; a remaining capacity calculation portion 18 that detects the battery remaining capacity of the based on calculation performed on signals input from the voltage, temperature and current detection portions 12, 14 and 16, and detects the maximum limit current value of the battery unit 20 based on the remaining capacity and the battery temperature; a communication processing portion 19 that transmits the calculated remaining capacity and maximum limit current value. The communication processing portion 19 is connected to a connection device communication terminal 30. The communication processing portion 19 is connected to a connection device through the connection device communication terminal 30, and transmits signals that represents the remaining capacity and the maximum limit current value to the connection device. In this embodiment, a vehicle such as car is used as the connection device. The power supply apparatus installed the vehicle drives a motor M that runs the vehicle. The communication processing portion 19 is connected to and communicates with a vehicle side control portion provided in the vehicle. The following description will describe the power supply apparatus for vehicles.

The rechargeable batteries 22 contained in the battery unit 20 are nickel-hydrogen batteries. However, the batteries may be nickel-cadmium batteries. One battery may be used. A plurality of batteries that are connected in serial or parallel, or in combination of serial and parallel connection may be used.

The voltage detection portion 12 detects the voltage of the rechargeable batteries 22 contained in the battery unit 20. Since the battery unit 20 in the figure includes a plurality of rechargeable batteries connected to each other in serial, the voltage detection portion detects the total voltage of the batteries connected to each other in serial. The voltage detection portion 12 provides the detected voltage as an analog signal to the remaining capacity calculation portion 18, or provides a digital signal that is converted from an analog signal by an A/D converter to the remaining capacity calculation portion 18. The voltage detection portion 12 detects the battery voltage constantly or periodically at a constant sampling period, and provides the detected voltage to the remaining capacity calculation portion 18.

The temperature detection portion 14 includes a temperature sensor 17 that detects the temperature of the batteries contained in the battery unit 20. The temperature sensor 17 is in contact with the battery surface or is in thermal contact with the battery so as to interpose a heat conductive material between them, or is close to the battery to provide thermal connection with the battery, and thus detects the battery temperature. The temperature sensor 17 is a thermistor. However, any elements capable of converting a temperature into an electric resistance such as PTC and varistor can be used as the temperature sensor 17. In addition, an element that can detect the temperature in the state where it is not in contact with the battery by sensing infrared rays radiated from the battery can be used. The temperature detection portion 14 also provides the detected battery temperature as an analog signal to the remaining capacity calculation portion 18, or provides a digital signal that is converted from an analog signal by an A/D converter to the remaining capacity calculation portion 18. The temperature detection portion 14 detects the battery temperature constantly or periodically at a constant sampling period, and provides the detected temperature to the remaining capacity calculation portion 18.

The current detection portion 16 includes a resistor element that is connected to the batteries in serial, and detects a discharge current that runs through the batteries by sensing a voltage induced at the both ends of the resistor element. The resistor element is a resistor with a low resistance. However, a semiconductor element such as transistor or FET can be used as the resistor element. Since charge and discharge currents run in the directions opposite to each other, the positive/negative polarities induced in the resistor element inversely appear. For this reason, a discharge current can be detected based on the polarity in the resistor element, and a current can be detected based on the voltage induced in the resistor element. The reason is that the current is proportional to the voltage induced in the resistor element. This current detection portion 16 can precisely detect the discharge current of the batteries. However, a structure that detects a current by sensing magnetic flux that leaks external of a lead line due to a current running through the lead line can be employed. The current detection portion 16 also provides the detected discharge current as an analog signal to the remaining capacity calculation portion 18, or provides a digital signal that is converted from an analog signal by an A/D converter to the remaining capacity calculation portion 18. The current detection portion 16 detects the discharge current constantly or periodically at a constant sampling period, and provides the detected discharge current to the remaining capacity calculation portion 18.

A apparatus that provides the signals of digital values from the voltage, temperature and current detection portions 12, 14 and 16 periodically at a constant sampling period sequentially provides the digital signals from the detection portions to the remaining capacity calculation portion 18 in a time shifting manner where timing for providing the digital signals is shifted.

The remaining capacity calculation portion 18 integrates the discharge currents of the battery to detect a discharge amount, and calculates the battery remaining capacity by subtracting the detected discharge amount. For example, in the case where a battery with full-charged capacity of 1000 mAh discharges an amount of 500 mAh, the remaining capacity becomes 50%. Thus, as the fully-charged battery discharges, its remaining capacity gradually decreases. In addition, the remaining capacity calculation portion 18 corrects the remaining capacity in a later-described manner. A memory connected to the remaining calculation portion 18 stores required values, data and settings for correction. A non-volatile memory such as EEPROM, and a volatile memory such as RAM can be used as the memory 11.

In addition, the remaining capacity is detected by using pulse discharging as described later. In this type of discharging, a discharged current is applied to a resistor (not shown) separately provided on the vehicle side. Additionally, a pre-charge resistor of the type disclosed in Japanese Laid-Open Publication Kokai No. 2002-267698 can be provided as a resistor for this type of discharging to apply a discharged current to the pre-charge resistor.

(Battery Remaining Capacity Detection Method)

In the operation of a vehicle by means of a power supply apparatus, it is necessary to precisely detect the battery remaining capacity. Generally, the battery remaining capacity is calculated by integrating detected charge and discharge currents. This method subtracts the discharge current from the charge current, and thus calculates the remaining capacity. The charge amount is calculated by integrating a charge current. The discharge amount is calculated by integrating a discharge current. The calculation method that calculates the remaining capacity based on the charge and discharge currents can calculate the remaining capacity also even in the case where the rechargeable batteries are nickel-hydrogen batteries or nickel-cadmium batteries. However, an error is produced due to a discharge current and battery temperature. For this reason, it is important to precisely ascertain the remaining capacity.

EXAMPLE 1

Figure 2:
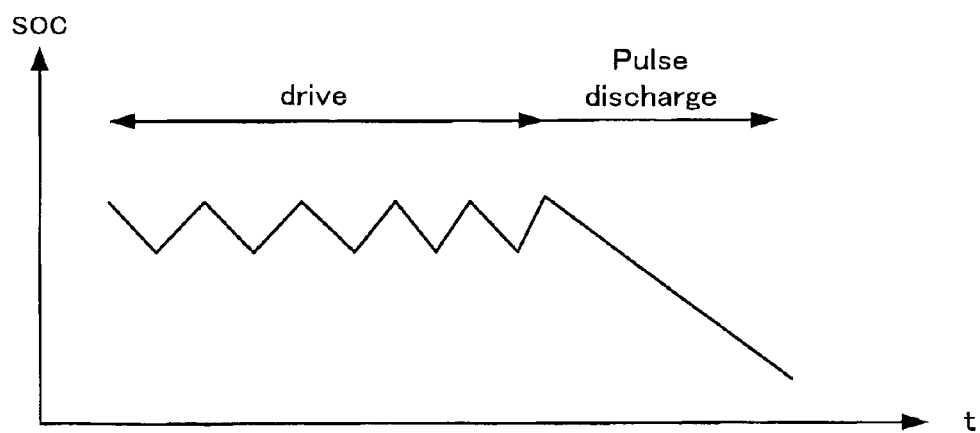
FIG. 2 is a graph showing battery remaining capacity variation when pulse discharging is performed after operation.

The following description will describe an example 1. In the operation of a car, SOC varies as shown in FIG. 2. The calculation of the battery capacity in the operation of a car is performed based on integration by a current sensor. In this embodiment, in a state where a car is not in operation, pulse discharging is performed as described later to obtain the battery remaining capacity corresponding to a reset voltage $V_{o\ reset}$ based on a battery initial voltage $V_{o\ ini}$. Note that the drive stop state refers to a state where a car is not in operation, in other words, the batteries do not drive a car. In the embodiment 1, the drive stop state is set to a state where the key is tuned off, but may be in a state the key is turned on. The remaining capacity can be more precisely detected based on a remaining capacity corresponding to the reset voltage $V_{o\ reset}$ during key-off periods. The battery capacity obtained based on the current integration in the operation as described above is rewritten to, that is, corrected to the remaining capacity corresponding to the reset voltage $V_{o\ reset}$. Accordingly, it is possible to precisely obtain the remaining capacity. In addition, in the case where it is used as a power supply apparatus for vehicles, when power is required to start driving a vehicle, precise remaining capacity detection can determine whether to be able to drive the vehicle. As a result, if in the case where the remaining capacity is a degree that cannot drive the vehicle, it is possible to take necessary measures for charging the batteries such as charging the batteries from the commercial power supply for home use. Particularly, in vehicles that are driven by power from a fuel battery and a nickel-hydrogen battery, since power is required to start the driving of the fuel battery, it is important to precisely detect the remaining capacity as described above. This type of pulse discharging is performed in a state a vehicle is not in operation (i.e., in parking). However, in order to prevent battery capacity reduction, if the battery operation is less than a prescribed time (e.g., three hours) before the operation of a vehicle is stopped, the pulse discharging is not performed.

Figure 3:
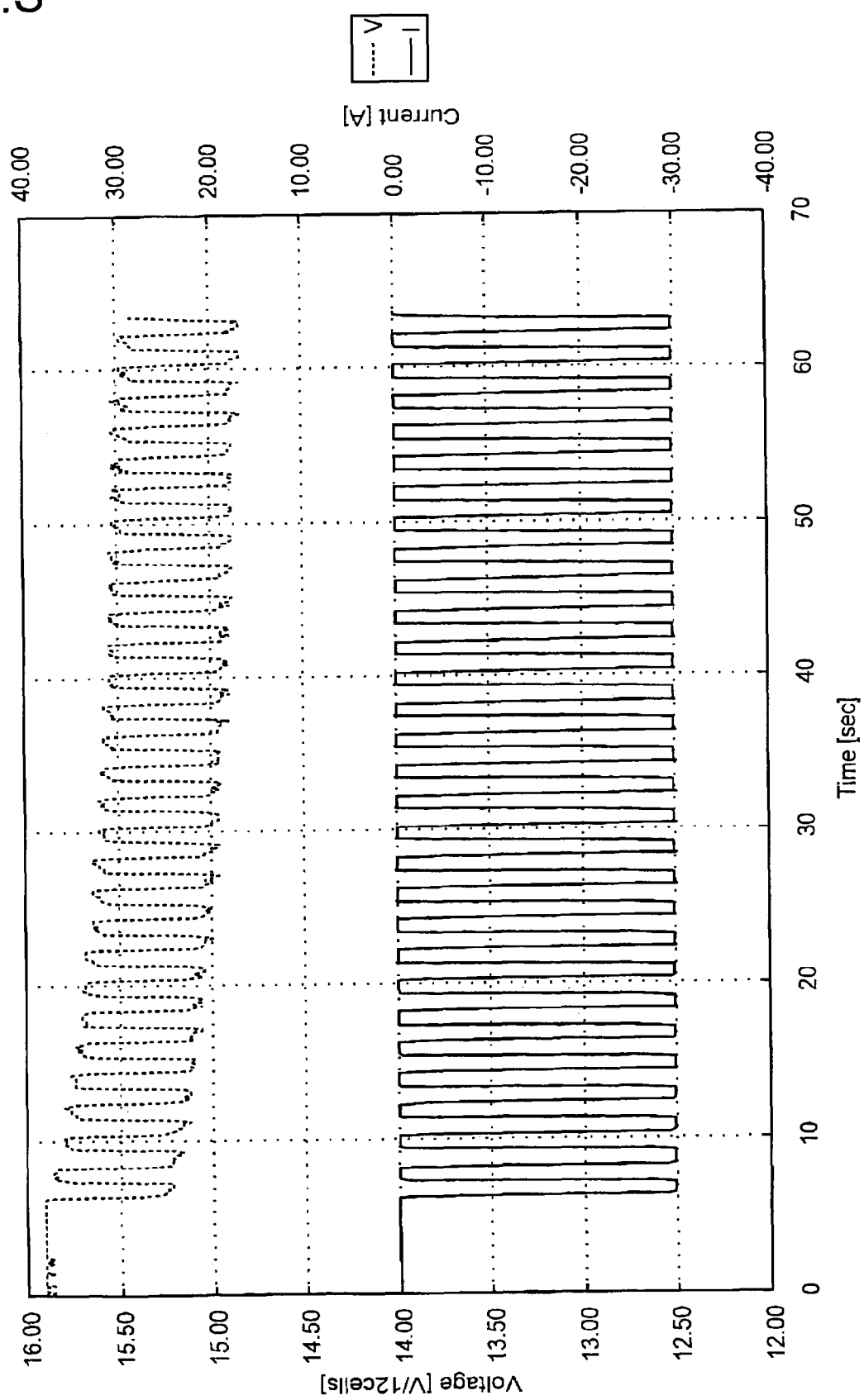
FIG. 3 is a graph showing battery remaining capacity variation when pulse discharging is performed.
Figure 4:
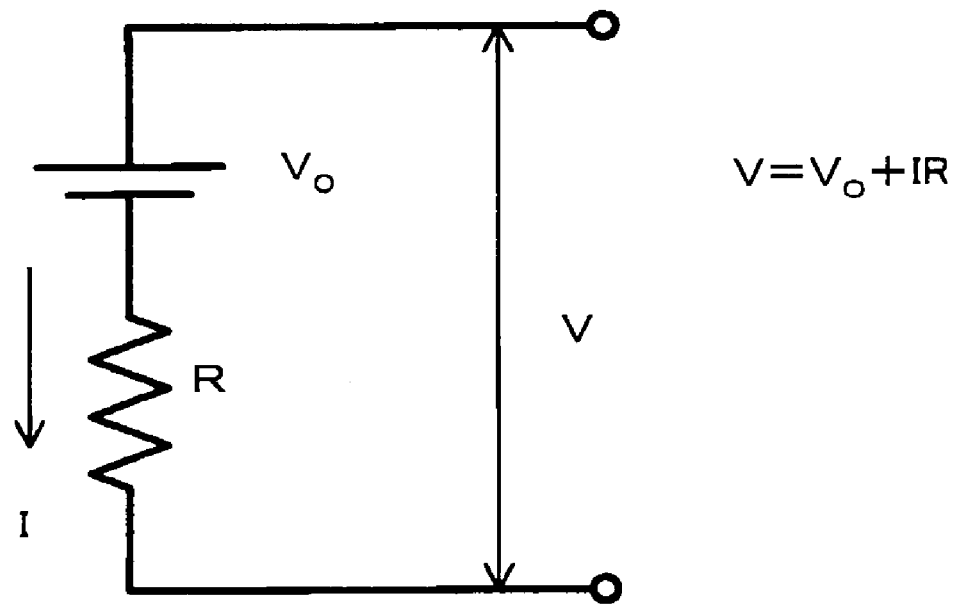
FIG. 4 is a circuit diagram showing relationship among battery internal resistance R, voltage $V_0$ and terminal output voltage V.

The following description will describe a method for obtaining the battery remaining capacity by pulse discharging. In the pulse discharging, a pulse current is discharged at a plurality of times as shown in FIG. 3. The pulse discharging is performed based on control from the vehicle side connected to the power supply apparatus. The batteries contained in the power supply apparatus have an internal resistance as shown in FIG. 4. Accordingly, an output voltage V that is output externally and an internal battery voltage $V_0$ are represented by the following equation.

$$V=V_o+IR \qquad \text{Equation 1}$$

In the above equation, I is a discharge current, R is an internal resistance. Since I and V can be actually measured by a voltage sensor, $V_o$ and R can be obtained by calculation. In addition, since $V_o$ and R are obtained based on the detection of I and V in a plurality of times of pulse current discharging, it is possible to improve precision of $V_o$ and R. In the example of FIG. 3, discharging at 30 A and resetting are repeated 29 to 34 times one second each to improve precision of $V_o$ and R. Thus, this type of pulse discharging is performed for about one minute. Particularly, a plurality of times of application of pulse current provide an effect that brings remaining capacity hysteresis constant, therefore, it is possible to more precisely obtain $V_0$, and so on. Additionally, a filter added thereto suppresses sharp change of $V_o$ and R.

Specifically, in the case where $V_n$ and $I_n$ are measured values of voltage and current in the pulse discharging, voltage and current infinitesimal variation amounts dV and dI are represented by the following equation, respectively. In this case, the voltage and current are measured periodically at a prescribed period, and $V_n$ and $I_n$ are the voltage and current in one measurement period.

$$dV=V_n-V_{n-1}$$

$$dI=I_n-I_{n-1} \qquad \text{Equation 2}$$

In this example, dV and dI are calculated every 0.1 second. In other words, in one time of pulse discharging, dV and dI are calculated ten times. If R is obtained, $V_0$ can be calculated based on the equation 1. The R is obtained by the following equation.

In addition, if $dI=I_n-I_{n-1}$ is not more than 0.2 A, since R cannot properly obtained, calculation is not performed, thus, calculation is performed based on the following equation 3 on the assumption of dV/dI=0. Note that, in this specification, "*" is used as a symbol of multiplication.

$$R=(dV/dI)_{n-1}*(1-a)+(dV/dI)_n*a \qquad \text{Equation 3}$$

In the above equation, (1−a) and a are multiplied for filtering to suppress sharp change, thus, variation due to noise, and so on, is reduced. In this case, adjustment of value a provides calculation of the internal resistance R in unit time variation that weights an immediate measured dV/dI.

In this example, $$a=0.01$$

The memory stores R obtained herein associated with temperature, and used in next calculation. In addition, $V_{On}$ and $V_o$ are obtained by the following equation. At the end of pulse discharging, $V_0$ can be calculated.

$$V_{on}=V_n-I_nR$$

$$\text{Equation } V_o=V_{on-1}*(1-a)+V_{on}*a \qquad 4$$

In the above equation, (1−a) and a are also multiplied for filtering. In this example, a=0.01

In addition, a in the equations 3 and 4 is not limited to the same value but may be set as an independent variable. A value of $V_0$ itself is not calculated as $V_0$, but a value that is filtered to suppress a time variation influence is obtained as $V_0$, thus, a stable value of $V_0$ can be obtained.

Thus obtained $V_0$ contains a memory effect. If a memory effect occurs, since the remaining capacity of battery varies, the remaining capacity of battery cannot be precisely obtained. The reason is described with reference to a graph of relationship between battery remaining capacity and voltage shown in FIG. 5. A curve $V_{o\ ini}$ shows relationship between voltage $V_o$ per one cell (unit: V) of a battery in the case where a memory effect does not occur and remaining capacity. A curve $V_{o\ reset}$ shows relationship between voltage $V_{o\ rest}$ (unit: V) that is experimentally and actually measured in a battery in the state where a memory effect occurs and remaining capacity.

A memory effect is described as follows. In the operation of power supply apparatus for vehicles according to the example 1, charging and discharging are controlled such that SOC of battery approaches about 50%. As shown in a SOC drive region of FIG. 5, in the case where a battery is used such that its remaining capacity is in proximity to 50%, as compared with the curve $V_{o\ ini}$ where a memory effect does not occur, the curve $V_{o\ reset}$ where a memory effect occurs has a reduced voltage even though having the same remaining capacity. The reduction difference, that is, the memory effect reduction difference is obtained as $V_m*C(SOC)$ described later to calculate the reset voltage $V_{o\ reset}$. The reset voltage $V_{o\ reset}$ that is obtained by subtracting a factor of the memory effect reduction difference (unit: V) corresponds to the remaining capacity, and thus can provide the remaining capacity more properly and precisely than a calculated reset voltage $V_{o\ reset}$.

Figure 5:
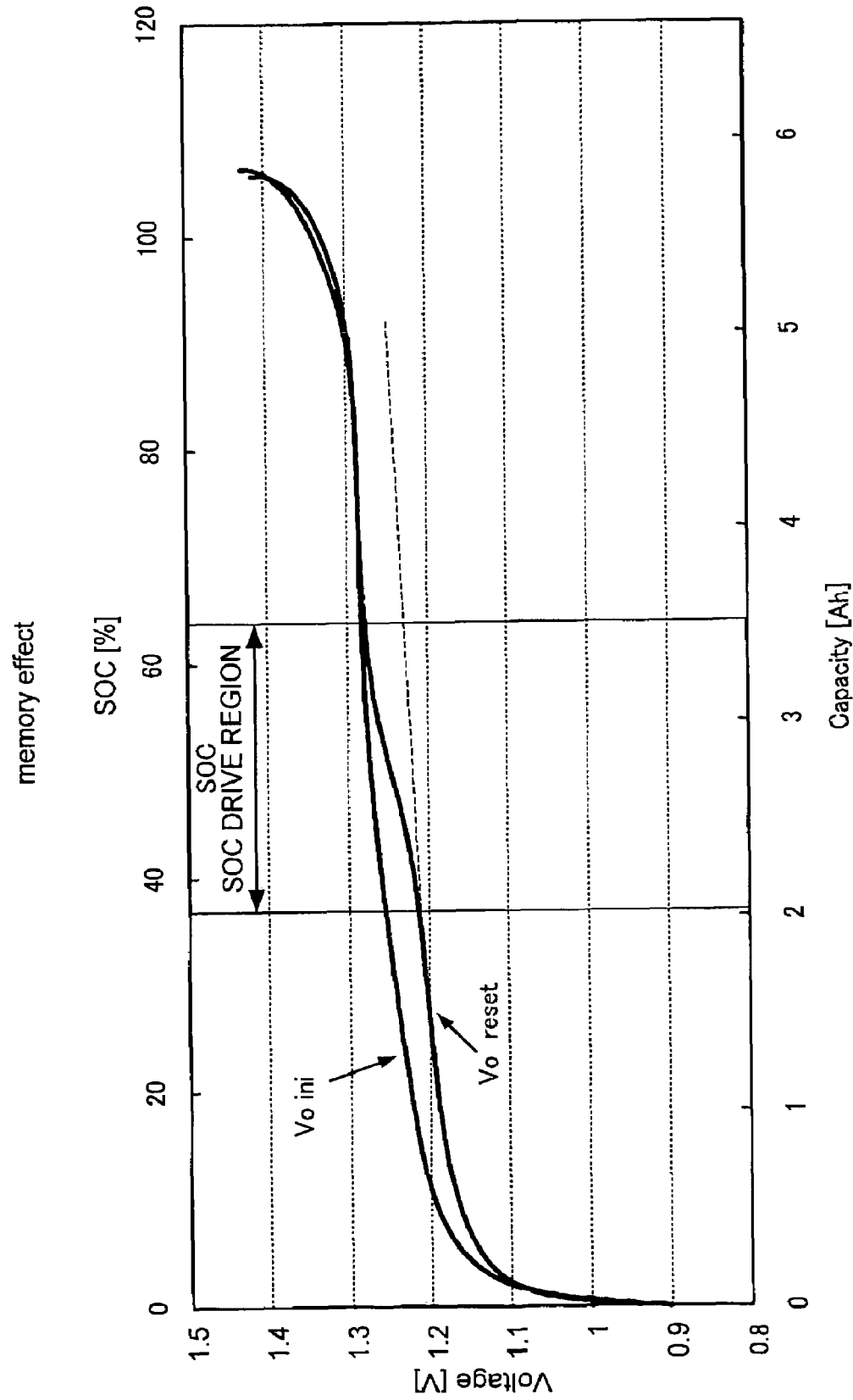
FIG. 5 is a graph showing relationship between battery remaining capacity and voltage.

In addition, the curve $V_{o\ reset}$ where a memory effect occurs as shown in FIG. 5 shows a state of a battery that is used to some extent, and values that are actually measured and obtained based on separated voltage measurement and remaining capacity measurement by discharging. This type of curve $V_{o\ reset}$ varies depending on elapsed battery use time, battery operation state, and so on. However, in various types of batteries during use, the difference between $V_{o\ ini}$ and $V_{o\ reset}(=V_m*C(SOC))$ shown in FIG. 5 has a similar tendency. Accordingly, in order to obtain the battery remaining capacity in consideration of a memory effect, the following calculation is performed.

$$V_{o\ reset} = V_{o\ ini} - V_m*C(SOC) \quad \text{Equation 5}$$

The initial voltage $V_{o\ ini}$ is an initial value of voltage $V_o$ and is obtained by using a table and so on representing correlation with the remaining capacity that is previously obtained as shown in Table 1. In addition, $V_m$ is a memory effect occurrence amount. This value is obtained by using a table and so on as shown in Table 2. Additionally, C(SOC) is a memory effect occurrence amount correction value for variation of the remaining capacity in operation. Examples of tables that obtain $V_{o\ ini}$ and $V_m$ are shown as follows. Tables used in the example 1 including Tables 1 and 2 are used for linear interpolation.

TABLE 1

| | Module Temperature [deg C.] | | | | | | |
|---|---|---|---|---|---|---|---|
| | −10 | 0 | 10 | 20 | 30 | 40 | 50 |
| V0 ini (SOC 65%) [V] | 15.11 | 15.37 | 15.55 | 15.72 | 15.77 | 15.90 | 15.92 |
| V0 ini (SOC 60%) [V] | 14.95 | 15.22 | 15.41 | 15.61 | 15.68 | 15.82 | 15.82 |
| V0 ini (SOC 50%) [V] | 14.62 | 14.91 | 15.14 | 15.39 | 15.49 | 15.66 | 15.62 |
| V0 ini (SOC 40%) [V] | 14.30 | 14.60 | 14.86 | 15.18 | 15.31 | 15.50 | 15.43 |
| V0 ini (SOC 30%) [V] | 13.97 | 14.29 | 14.59 | 14.96 | 15.12 | 15.35 | 15.23 |
| V0 ini (SOC 20%) [V] | 13.34 | 13.86 | 14.11 | 14.74 | 14.90 | 15.10 | 14.97 |
| V0 ini (SOC 10%) [V] | 12.80 | 13.38 | 13.65 | 14.12 | 14.37 | 14.70 | 14.62 |

TABLE 2

| | Ctr | | | | | | | | | |
|---|---|---|---|---|---|---|---|---|---|---|
| | 0 | 193967 | 387933 | 581900 | 969833 | 3879330 | 12607823 | 50431294 | 201725175 | 806900698 |
| Vm (SOC 65%) [V] | 0.00 | 0.14 | 0.22 | 0.25 | 0.30 | 0.55 | 0.78 | 1.00 | 1.07 | 1.25 |
| Vm (SOC 60%) [V] | 0.00 | 0.14 | 0.21 | 0.24 | 0.29 | 0.52 | 0.75 | 0.97 | 1.03 | 1.20 |
| Vm (SOC 50%) [V] | 0.00 | 0.13 | 0.20 | 0.22 | 0.27 | 0.48 | 0.69 | 0.90 | 0.95 | 1.11 |
| Vm (SOC 40%) [V] | 0.00 | 0.12 | 0.19 | 0.21 | 0.25 | 0.44 | 0.64 | 0.83 | 0.87 | 1.01 |
| Vm (SOC 30%) [V] | 0.00 | 0.12 | 0.17 | 0.19 | 0.23 | 0.39 | 0.58 | 0.76 | 0.79 | 0.92 |
| Vm (SOC 20%) [V] | 0.00 | 0.11 | 0.16 | 0.18 | 0.22 | 0.37 | 0.56 | 0.73 | 0.75 | 0.87 |
| Vm (SOC 10%) [V] | 0.00 | 0.11 | 0.16 | 0.17 | 0.20 | 0.35 | 0.52 | 0.69 | 0.69 | 0.81 |

In Table 1, the temperature is a battery temperature that is measured in calculation of $V_0$. Obtainment of the rest voltage $V_{o\ reset}$ in Equation 5 by using Tables 1 and 2 is described as follows. First, $V_0$ is obtained based on Equation 4. For example, in the case where the measured and calculated $V_0$ is $V_0=15.31$ V (in the example 1, twelve nickel-hydrogen batteries connected in serial are used), when the battery temperature is 30° C., $V_{o\ ini}$ (SOC 40%) at the left end column in Table 1 is obtained based on Table 1. In this case, if the battery is a fresh battery, the remaining capacity is SOC 40%.

TABLE 3

| | Module Temperature [deg C.] | | | | | | |
|---|---|---|---|---|---|---|---|
| | −10 | 0 | 10 | 20 | 30 | 40 | 50 |
| V0 reset (SOC 65%) [V] | 14.86 | 15.13 | 15.30 | 15.47 | 15.52 | 15.65 | 15.67 |
| V0 reset (SOC 60%) [V] | 14.71 | 14.98 | 15.17 | 15.37 | 15.44 | 15.58 | 15.58 |
| V0 reset (SOC 50%) [V] | 14.40 | 14.69 | 14.91 | 15.17 | 15.27 | 15.44 | 15.40 |
| V0 reset (SOC 40%) [V] | 14.09 | 14.39 | 14.65 | 14.97 | 15.10 | 15.30 | 15.22 |

TABLE 3-continued

| | Module Temperature [deg C.] | | | | | | |
|---|---|---|---|---|---|---|---|
| | −10 | 0 | 10 | 20 | 30 | 40 | 50 |
| V0 reset (SOC 30%) [V] | 13.78 | 14.10 | 14.40 | 14.77 | 14.93 | 15.15 | 15.04 |
| V0 reset (SOC 20%) [V] | 13.16 | 13.68 | 13.93 | 14.56 | 14.72 | 14.92 | 14.79 |
| V0 reset (SOC 10%) [V] | 12.63 | 13.21 | 13.48 | 13.95 | 14.20 | 14.53 | 14.45 |

On the other hand, if the battery is not a fresh battery, when later-described Ctr is 581900, 0.17 V (SOC 10%) to 0.25 V (SOC 65%) in Table 2 are obtained. The obtained value is multiplied by later-described C(SOC). If C(SOC) is 1, $V_m$ remains 0.17 V to 0.25 V. $V_{o\ reset\ table}$ in Table 3 is obtained by subtracting $V_m$ from each value of $V_{o\ ini\ table}$ in Table 1 for each SOC % corresponding to each temperature.

Pulse discharging is performed in a state where the battery is not in operation in a key-off state where a vehicle is not in operation after initial operation. In the case where the measured and calculated $V_0$ is $V_0$=15.10 V, when the battery temperature is 30° C., the remaining capacity SOC=40% can be obtained with reference to Table 4.

This relation can be represented by the following equation if expressed in the form of Equation 5, $V_{o\ reset}=V_{o\ ini}-V_m*C(SOC)$ $V_{o\ reset}$ (value 15.10, 30° C. in Table 3, $V_0(40\%))=V_{o\ ini}$ (value 15.31, 30° C. in Table 1, $V_0(40\%))-V_m$ (value 0.21, 0.21 in Table 2, $V_m(40\%))*C(SOC)$ (value 1)

Ctr is calculated by the following equation.

$$Ctr=\Sigma(|I|*a(Ctb)*b(T))  \quad\quad \text{Equation 6}$$

Ctr is a counter value that determines the memory effect occurrence amount. In an operation state of a battery during operation of a vehicle (during driving), I is a current value (a value that is measured periodically at a prescribed period (e.g., 1 S) (specifically, an average value of currents that are measured during the prescribed period), (unit: A). a (Ctb) is a correction coefficient for battery deterioration. b (T) is a correction coefficient for battery temperature (a value in Table 4 corresponding to a temperature that is measured periodically at the prescribed period similarly to I).

Ctr is obtained by multiplying these values and integrating them periodically at a prescribed period (e.g., 1 S). Ctr is a value that is obtained by multiplication and integration as shown in Equation 6, and has a positive correlation with $V_m$ as shown in Table 2.

Among them, b(T) and a(Ctb) can be calculated by using a table and so on, and for example, can be obtained with reference to the following table. As shown in Table 4, b(T) has a positive correlation with the battery temperature. As for Ctr, data is accumulated from start of battery use until processing such as complete discharging of the battery in maintenance.

Ctr is a value that is reset to zero when complete discharging of a battery (refresh processing) is performed. In the memory effect occurrence amount $V_m$, Ctb is an accumulated value as described later. After Ctr becomes zero, it is multiplied by the accumulated value Ctb similarly to Equation 6. Thus, after refresh processing, Ctr quickly becomes a large value.

TABLE 4

| | Module temperature [deg C.] | | | | | | |
|---|---|---|---|---|---|---|---|
| | −10 | 0 | 10 | 20 | 30 | 40 | 50 |
| b(T) | 0.223 | 0.368 | 0.608 | 1.503 | 2.055 | 2.731 | 6.707 |

TABLE 5

| | Ctb | | | | | | | | |
|---|---|---|---|---|---|---|---|---|---|
| | 0 | 12607823 | 25215647 | 50431293.6 | 75646940.5 | 113470410.7 | 151293880.9 | 226940821.4 | 302587762 |
| a(Ctb) | 1.000 | 2.350 | 3.815 | 6.192 | 8.221 | 10.914 | 13.345 | 17.718 | 21.663 |

In addition, the counter value Ctb of a factor that determines battery deterioration can be calculated by the following equation.

$$Ctb=\Sigma(|I|\times a(T))  \quad\quad \text{Equation 7}$$

I is a current value that is measured (periodically at a prescribed period (e.g., 1 S) similarly to I in Equation 6, unit: A). a(T) is a correction coefficient for the battery temperature (a value in Table 6 corresponding to the temperature that is measured periodically at the prescribed period similarly to I), and can be obtained by using the temperature as a parameter with reference to a table and so on. One example of a table that determines a(T) is shown in the following Table 6. The correction coefficient for battery temperature a(T) has a positive correlation with the battery temperature.

Ctb is obtained by multiplying these values and integrating them at a prescribed period (e.g., 1 S). The factor of Ctb is an accumulated value from start of battery use until battery replacement. For this reason, it is a factor that determines battery deterioration. It is confirmable in Table 5 that a(Ctb) of correction coefficient for battery deterioration has a positive relation with Ctb.

TABLE 6

| | Module temperature [deg C.] | | | | | | |
|---|---|---|---|---|---|---|---|
| | −10 | 0 | 10 | 20 | 30 | 40 | 50 |
| a(T) | 0.307 | 0.480 | 0.654 | 0.827 | 1.000 | 1.173 | 1.346 |

In addition, memory effect correction amount C(SOC) in Equation 5 is determined based on a table and so on. In this example, it is determined based on the following table.

TABLE 7

| | CAN SOC – D(%) | | | | | |
|---|---|---|---|---|---|---|
| | <=a | a + (b – a)*0.1 | a + (b – a)*0.3 | a + (b – a)*0.5 | a + (b – a)*0.8 | b |
| C(SOC) | 1 | 0.9 | 0.25 | 0.18 | 0.1 | 0 |

Figure 6:
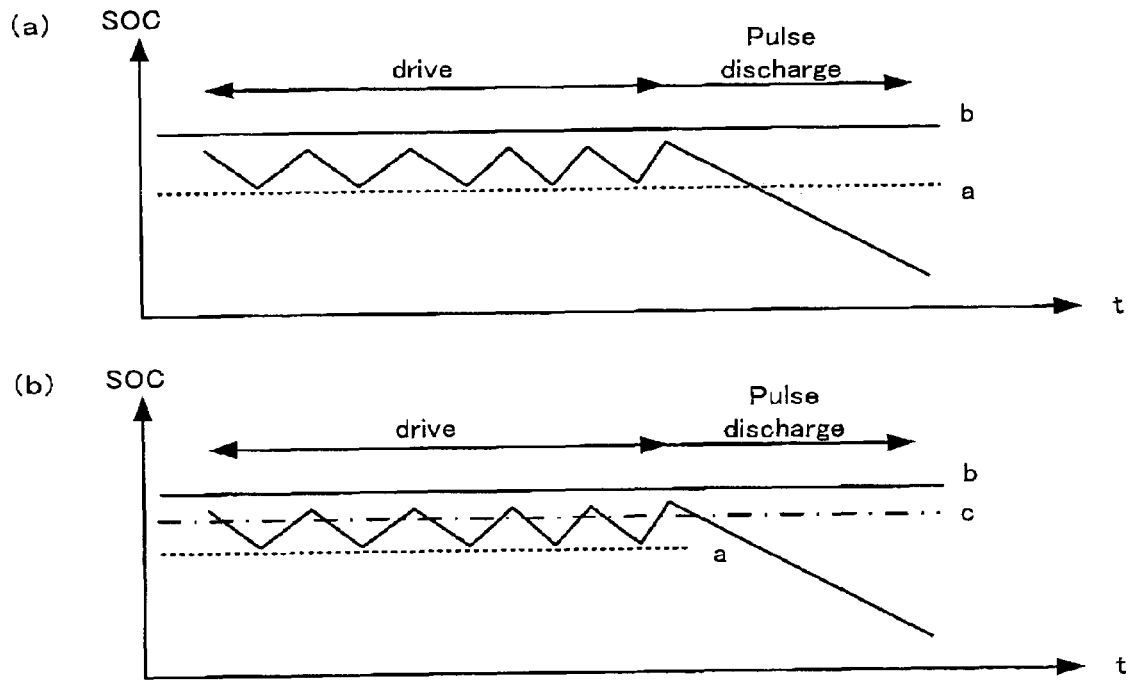
FIG. 6 is a graph showing the maximum and minimum values in the battery remaining capacity variation when pulse discharging is performed after operation.

CAN SOC in this table at the end of pulse discharging is a remaining capacity ($SOC_{cal}$) that is calculated by integration of current values. In addition, as shown in FIG. 6(a), a is the remaining capacity minimum value $SOC_{min}$ in operation (=drive), and b is the remaining capacity maximum value $SOC_{max}$ in operation. After the position of CAN SOC (=$SOC_{cal}$) between a and b is thus obtained, C(SOC) is, obtained. $SOC_{min}$ and $SOC_{max}$ are rewritten in every pulse discharging in a state where operation is not performed. Values of $SOC_{min}$ and $SOC_{max}$ in operation after that are updated and stored, and are used in next pulse discharging in a state where operation is not performed.

For example, in the case of normal use, a is about 45%, and b is about 55%. Thus, values of the middle row in the above Table 7 are 45%, 46%, 50%, 53%, and 55%, from the left side. The remaining capacity before pulse discharging is normally about 50%. Pulse discharging in the example 1 corresponds to 5% of the SOC of discharging. Accordingly, after pulse discharging, $SOC_{cal}$ becomes 45%. As a result, C(SOC) in Table 7 is normally 1.

Processing is performed such that if $SOC_{cal}$ at the end of pulse discharging is close to a it is set to 1, if close to b, it is set to 0. The reason is that, since, as shown in FIG. 5, as for the remaining capacity in operation, a is located in proximity to the left end of the SOC drive region, and b is located in proximity to the right end, the difference between the curve $V_{o\ ini}$ where a memory effect does not occur and the curve $V_{o\ reset}$ where a memory effect occurs is large in proximity to the left end, and is small in proximity to the right end. Thus, a value of C(SOC) in Table 7 is used.

In this example, the remaining capacity minimum value $SOC_{min}$ in operation (driving) is used as a, and the remaining capacity maximum value $SOC_{max}$ in operation (driving) is used as b. However, alternatively, the remaining capacity minimum value $SOC_{min}$ and the remaining capacity maximum value $SOC_{max}$ in an operation state from a prescribed time before key-off in a state where operation is stopped (e.g., a prescribed time between 10 minutes and 40 minutes, preferably between 10 minutes and 40 minutes, most preferably about 20 minutes) until key-off may be used, thus, Table 7 may be used. As compared with the case where the maximum and minimum remaining capacities in the whole operation are used, in the case where the maximum and minimum remaining capacities from a prescribed time before key-off until key-off are used, C(SOC) and $V_{o\ reset} = V_{o\ ini} - V_m \ast C(SOC)$ tend to be more properly obtained.

In addition, the curve $V_{o\ reset}$ in FIG. 5 corresponding to memory effect reduction shows a state of a battery that is used to some extent, and values that are actually measured and obtained based on separated voltage measurement and remaining capacity measurement by discharging. This type of curve $V_{o\ reset}$ varies depending on elapsed battery use time, battery operation state, and so on. However, in various types of batteries during use, the difference between $V_{o\ ini}$ and $V_{o\ reset}(=V_m \ast C(SOC))$ shown in FIG. 5 has a similar tendency.

In this example, $SOC_{cal}$ at the end of pulse discharging is used. Alternatively, $SOC_{cal}$ that is obtained by integration of currents until when operation is stopped may be used. In this case, values are different from the table values in Table 7.

Meaning of memory effect correction amount C(SOC) is described. As shown in FIG. 5, as comrade with the curve $V_o\ ini$ where a memory effect does not occur, the curve $V_{o\ reset}$ where a memory effect occurs has a difference in voltage even though having the same remaining capacity. Although the (vertical) width of the difference varies depending on a battery use state, the difference corresponding to the remaining capacity has a tendency as shown in FIG. 5. The memory effect occurrence amount correction value C(SOC) approaches 1 in the case where a remaining capacity used in a battery operation state before calculation of voltage $V_0$ is used in a region where the difference is large (a region where a memory effect is large). On the other hand, in the case where the difference is small (a region where a memory effect is small), it approaches zero. In a battery operation state, charging and discharging are repeated such that SOC approaches 50% as the center. Accordingly, remaining capacity record in operation is ascertained as described above, and takes an effect as the memory effect occurrence amount correction value C(SOC).

In this example, in the occurrence amount $V_m$ based on the memory effect, the counter Ctr of the memory effect occurrence amount is used. The counter value Ctb of a factor that determines battery deterioration is contained therein. As for a term for memory effect Ctr and a term for life, counters Ctb are prepared for each. Battery remaining capacity detection is performed by using the two counters in consideration of these factors. Particularly, as for a term for memory effect and a term for life, both of them have effects on the battery remaining capacity, but their behaviors are different. For example, the effect caused by a memory effect is eliminated once a battery completely discharges, on the other hand, the effect caused by life is not eliminated. In addition, the effect caused by a memory effect increases as the battery temperature increases. Additionally, life has an effect on a memory effect. For this reason, these factors are used as separated correction coefficients for calculation. As a result, it is possible to precisely estimate the battery remaining capacity.

Note that the values with correlation shown in the various tables in this specification are based on measurement, actual measurement, calculation, and so on. In order to more properly and precisely obtain the battery remaining capacity, based on measurement, actual measurement, calculation, and so on, different values and correction coefficients can be used.

EXAMPLE 2

Furthermore, in the battery remaining capacity detection method according to an example 2, instead of Equation 6, the following equation 8 is used to estimate a memory effect.

$$Ctr = \Sigma(|I_2| \ast R | \ast a(Ctb) \ast b(T)) \qquad \text{Equation 8}$$

Ctr is a counter that determines a memory effect occurrence amount. I is a current value (a value that is measured periodically at a prescribed period (e.g., 1 S), and its unit is A). R is a resistance value (an internal resistance that appears in pulse discharging in immediately before key-off and is shown in the foregoing Equation 3 is used). a(Ctb) is a correction coefficient relating to battery deterioration (the same as a(Ctb) in Equation 6). b(T) is a correction coefficient corresponding to a second battery temperature (the same as b(T) in Equation 6). Ctr is obtained by multiplying these values and integrating them at a prescribed period (e.g., 1 S). Correlation similar to Table 2 can be used as correlation between Ctr and $V_m$. Values that are obtained by multiplying the values in Table 2 by fixed coefficient and so on as appropriate can be used. Equation 8 contains $I_2*R$ proportional to a heat amount. Since the occurrence amount $V_m$ based on the memory effect also depends on a heat amount, the example 2 is effective.

EXAMPLE 3

Still Furthermore, in the battery remaining capacity detection method according to an example 3, instead of the counter value Ctr that determines a memory effect occurrence amount represented by the foregoing Equation 6, a counter value Ctr represented by the following Equation 9 is used. In operation (drive) of a vehicle, integration is performed at timing of switching between charging and discharging of current. Additionally, in this case, for example, depending on a charge current value and so on, a remaining capacity can be directly corrected. The following equation is used as one example.

$Ctr=\Sigma Ctr1$ $Ctr1=b(T)*a(Ctb)*c(capa)$   Equation 9

When the current running direction is reversed (i.e., in switching between charging and discharging), that is, in the case of $I_n>0$ and $I_{n-1}<0$, or in the case of $I_n<0$ and $I_{n-1}>0$, the above equation provides Ctr that is obtained by integration of Ctr1.

$I_n$ is a current value that is measured periodically at the prescribed period, and represents a current value in one measurement period. Thus, $I_{n-1}$ is a current value that is measured in a prescribed period right before the period where $I_n$ is measured. b(T) and a(Ctb) are the same as Equation 6.

Ctr is a counter that determines a memory effect occurrence amount, and is used similarly to Ctr in Equation 6. In addition, correlation similar to Table 2 can be used as correlation between Ctr and $V_m$. Values that are obtained by multiplying the values in Table 2 by fixed coefficient and so on as appropriate can be used. a (Ctb) is a correction coefficient for battery deterioration. b (T) is a correction coefficient for battery temperature. c(capa) is coefficient for a charging or discharging amount before from previous switching between charging and discharging until this switching between charging and discharging, and is shown in Table 8.

TABLE 8

| | charge or discharge amount [Ah] | | | | | |
|---|---|---|---|---|---|---|
| | 0.1 | 0.2 | 0.3 | 0.4 | 0.5 | 1 | 2 |
| c(capa) | 1 | 0.9 | 0.8 | 0.7 | 0.6 | 0.1 | 0.05 |

Values that are obtained by multiplying the temperature coefficient b(T), the life coefficient a(Ctb), and the charge/discharge amount coefficient c(capa) are integrated at timing of switching between charging and discharging as described above. In this case, as compared with Equation 6, effective points of Ctr in Equation 9 is described as follows.

As one factor of memory effect, it is considered that, as the number switching between charging and discharging of current increases, a memory effect increases. For this reason, when the current running direction is reversed, integration of Ctr is performed, thus, Ctr in Equation 9 increases. In addition, the coefficient c(capa) corresponds to a phenomenon where a memory effect decreases in the case where a charge/discharge amount in one time of charging/discharging is large. In the case where a charge/discharge amount is large, this coefficient is set to be small, thus, Ctr1 and Ctr in Equation 6 are brought small.

EXAMPLE 4

Still Furthermore, in the battery remaining capacity detection method according to an example 4, the memory effect occurrence amount correction value C(SOC), instead of the method described with reference to the foregoing Table 7, is obtained as follows. In this case, as shown in FIG. 6(b), as for the remaining capacity in operation, the maximum value $SOC_{max}(=b)$, the minimum value $SOC_{min}(=a)$, and an average value $SOC_{ave}(=c)$ are obtained. After the position of remaining capacity $SOC_{cal}$ (CAN SOC) that is calculated before correction between a and b is confirmed based on the following Tables 9 and 10, C(SOC) is obtained.

In the memory effect occurrence amount correction value C(SOC) that allows remaining capacity record in operation to take an effect as described above, as compared with the foregoing Table 7, in the example 4, since the average value $SOC_{ave}(=c)$ is also used, the remaining capacity record in operation can more properly take an effect.

TABLE 9

| | CAN SOC – D(%) | | | | | |
|---|---|---|---|---|---|---|
| | <=a | a + (c – a)*0.1 | a + (c – a)*0.3 | a + (c – a)*0.5 | a + (c – a)*0.8 | c |
| C(SOC) | 1 | 0.95 | 0.9 | 0.8 | 0.6 | 0.5 |

TABLE 10

| | CAN SOC – D(%) | | | | | |
|---|---|---|---|---|---|---|
| | c | c + (b – c)*0.1 | c + (b – c)*0.3 | c + (b – c)*0.5 | c + (b – c)*0.8 | b |
| C(SOC) | 0.5 | 0.4 | 0.2 | 0.1 | 0.05 | 0 |

$SOC_{min}$, $SOC_{ave}$ and $SOC_{max}$ are rewritten in every pulse discharging in a state where operation is not performed. Values of $SOC_{min}$, $SOC_{ave}$ and $SOC_{max}$ in operation after that are updated and stored, and are used in next pulse discharging in a state where operation is not performed. For example, in the case where a, b and c are 40%, 60% and 50%, respectively, values of the middle row in Table 9 are 40%, 41%, 43%, 45% and 50%, from the left side, and values of the middle row in theabove Table 10 are 50%, 51%, 53%, 55%, 58% and 50%.

EXAMPLE 5

Figure 7:
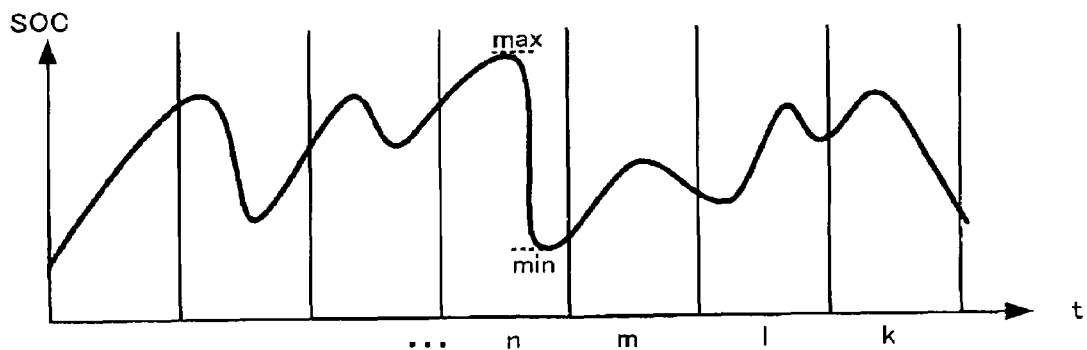
FIG. 7 is a graph showing the state that obtains the maximum and minimum values in each period in a time division manner that divides battery remaining capacity time variation into unit periods.

Still Furthermore, in the battery remaining capacity detection method according to an example 5, the memory effect occurrence amount correction value C(SOC), instead of the method described with reference to the foregoing Table 7, is obtained as follows. As shown in FIG. 7, the remaining capacity is obtained in each of prescribed periods. Weighting is performed so as to have a more effect as it is later.

First, in operation of motor, the remaining capacity minimum value $SOC_{min}(=a)$ and maximum value $SOC_{max}(=b)$ are obtained in each of the divided prescribed periods. C(SOC) is calculated based on these values in each period similarly to the method of FIG. 7. As for C(SOC) calculated in each period, a final value of C(SOC) is obtained based on the following Equation 10.

$$C(SOC) = k*C(SOC)_n + I*C(SOC)_{n-1} + m*C(SOC)$$

$$k + I + m + \ldots = 1$$

$$1 > k > I > m > \ldots > 0 \quad \text{Equation 10}$$

$C(SOC)_n$ represents C(SOC) in one period n. In this case, since coefficients (k, l, m, and so on) become larger as they are later, the memory effect occurrence amount correction value C(SOC) allows remaining capacity record to have a more effect as its use in operation is later.

EXAMPLE 6

The remaining capacity is calculated based on Equation 5, $V_{o\ reset} = V_{o\ ini} - V_m*C(SOC)$, in pulse discharging as described in foregoing examples.

Although the reason is not clear, in the case where a car is parked for long time (e.g., one month or more) without use of battery, the applicant confirms as follows. The self discharging reduction difference $V_{ms}$ from the initial voltage $V_{o\ ini}$ caused by self discharging becomes more predominant than $V_m*C(SOC)$ that is the memory effect reduction difference from the initial voltage $V_{o\ ini}$. In this case, a reset voltage $V_{o\ reset}$ is obtained based on the following Equation 11, thus, a remaining capacity corresponding to this is obtained.

$$V_{o\ reset} = V_{o\ ini} - V_{ms} \quad \text{Equation 11}$$

It is determined whether $V_m*C(SOC)$ that is the memory effect reduction difference or the self discharging reduction difference $V_{ms}$ is larger, and more predominant to obtain the remaining capacity as follows.

In the case of parking or not in use for long time, after a battery is operated, the pulse discharging in the foregoing example 1 is performed to obtain the calculated voltage $V_0$. Specifically, if the result is the same as the example 1, in the method of the example 1, $V_{o\ reset}$ (value 15.10, 30° C. in Table 4, $V_0(40\%)$) = $V_{o\ ini}$ (value 15.31, 30° C. in Table 1) – $V_m$ (value 0.21, 0.21 in Table 2, $V_m(40\%)$)*C(SOC) (value 1) is obtained. In this case, Ctr is 581900.

On the other hand, in the example 6, if a self discharging amount is 0.3 Ah, according to Tables 11 and 12 (described later), $V_{o\ reset}$ (value 15.10, 30° C. in Table 12, linearly interpolated $V_0(58\%)$) = $V_{o\ ini}$ (value 15.64, obtained by linear interpolation of SOC 58% at 30° C. in Table 1) – $V_m$ (linearly interpolated value 0.54 in Table 11, $V_{ms}(58\%)$)*C(SOC) (value 1) is obtained.

If C(SOC) is value 1, the value of $V_m$ in each SOC in the case where Ctr in Table 2 is 581900, and the value of $V_{ms}$ in each SOC in the case where the self discharging amount in Table 11 is 0.3 Ah is compared on the condition that SOC is the same. In this case, $V_m$ is larger in any SOC [%], thus, the remaining capacity SOC=58% is obtained based on $V_{o\ reset}$ on Equation 11 as described above.

The following description describes procedures that obtains the remaining capacity based on the reset voltage $V_{o\ reset}$ (measured voltage $V_o$) in the example 6. A self discharging amount [AH] is separately measured. According to Table 11, for example, in the case of 0.3 [AH], 0.29 V (SOC 10%) to 0.56 V (SOC 65%) in Table 11 are obtained. In each SOC %, $V_{o\ reset\ table}$ in Table 12 is obtained by subtracting these values from each value of $V_{o\ ini\ table}$ in Table 1.

Pulse discharging is performed in a state where the battery is not in operation in a key-off state where a vehicle is not in operation after self discharging. In the case where the measured and calculated $V_0$ is $V_0 = 15.10$ V, when the battery temperature is 30° C., the remaining capacity SOC=58% can be obtained with reference to Table 12.

In this example, since $V_{ms}$ is larger than $V_m$ (in the case where C(SOC) is a value 1) in all of SOC [%], $V_{ms}$ is used. However, in consideration of various cases, $V_m*C(SOC)$ and $V_{ms}$ are compared, thus, a larger value is used. The value "$V_m*C(SOC)$ or $V_{ms}$" in each SOC is used, and $V_{o\ reset\ table}$ such as in Table 3 or 12 is prepared by subtracting the value from each value of $V_{o\ ini\ table}$ in Table 1. As a result, the remaining capacity SOC is obtained based on the measured and calculated voltage $V_0$, and battery temperature.

Specifically, in the example 1, in the case where Ctr is 3879330, if C(SOC) is value 1, a value of $V_m$ in Table 2 is obtained. In the example 6, in the case where a self discharging amount is 0.3 [AH], a value of $V_{ms}$ in Table 12 is obtained. These values are compared on the condition that SOC is the same. For ease of understanding, in comparison in the following Table 13, except for SOC 10%, Vm is larger. In SOC 10%, $V_m*C(SOC)$ is larger. A value "$V_m*C(SOC)$ or $V_{ms}$" that is a larger value is prepared in each SOC. In each of SOC %, $V_{o\ reset\ table}$ such as in Table 3 or 12 is additionally prepared by subtracting the value from each value of $V_{o\ ini}$ table in Table 1. As a result, the remaining capacity SOC is obtained based on the measured and calculated voltage $V_0$, and battery temperature. In this case, in the case where $V_{o\ reset}$ is a value of SOC 10%, $V_m$ is used. In addition, in the case where $V_{o\ reset}$ is SOC 20% or more, $V_{ms}$ is used.

TABLE 11

| Voltage [V] | Self Discharge amount (Ah) | | | | | | | | | | |
|---|---|---|---|---|---|---|---|---|---|---|---|
| | 0 | 0.1 | 0.2 | 0.3 | 0.4 | 0.5 | 0.6 | 0.7 | 0.8 | 1.0 | <1.0 |
| Vms (SOC 65%) [V] | 0.00 | 0.21 | 0.40 | 0.56 | 0.70 | 0.81 | 0.89 | 0.95 | 0.98 | 0.98 | 0.98 |
| Vms (SOC 60%) [V] | 0.00 | 0.21 | 0.39 | 0.55 | 0.68 | 0.79 | 0.87 | 0.93 | 0.96 | 0.96 | 0.96 |
| Vms (SOC 50%) [V] | 0.00 | 0.20 | 0.37 | 0.52 | 0.65 | 0.75 | 0.83 | 0.88 | 0.91 | 0.91 | 0.91 |
| Vms (SOC 40%) [V] | 0.00 | 0.19 | 0.35 | 0.49 | 0.61 | 0.71 | 0.79 | 0.84 | 0.87 | 0.87 | 0.87 |
| Vms (SOC 30%) [V] | 0.00 | 0.18 | 0.33 | 0.47 | 0.58 | 0.67 | 0.74 | 0.80 | 0.83 | 0.83 | 0.83 |
| Vms (SOC 20%) [V] | 0.00 | 0.15 | 0.29 | 0.41 | 0.51 | 0.60 | 0.66 | 0.71 | 0.75 | 0.76 | 0.76 |
| Vms (SOC 10%) [V] | 0.00 | 0.10 | 0.20 | 0.29 | 0.37 | 0.45 | 0.52 | 0.58 | 0.64 | 0.72 | 0.72 |

TABLE 12

| | Temperature [deg C.] | | | | | | |
|---|---|---|---|---|---|---|---|
| | −10 | 0 | 10 | 20 | 30 | 40 | 50 |
| V0 reset (SOC 65%) [V] | 14.55 | 14.81 | 14.99 | 15.15 | 15.21 | 15.34 | 15.36 |
| V0 reset (SOC 60%) [V] | 14.40 | 14.67 | 14.86 | 15.06 | 15.13 | 15.27 | 15.27 |
| V0 reset (SOC 50%) [V] | 14.10 | 14.39 | 14.62 | 14.87 | 14.97 | 15.14 | 15.10 |

TABLE 12-continued

| | Temperature [deg C.] | | | | | | |
|---|---|---|---|---|---|---|---|
| | −10 | 0 | 10 | 20 | 30 | 40 | 50 |
| V0 reset (SOC 40%) [V] | 13.81 | 14.11 | 14.37 | 14.68 | 14.81 | 15.01 | 14.93 |
| V0 reset (SOC 30%) [V] | 13.51 | 13.83 | 14.12 | 14.49 | 14.66 | 14.88 | 14.76 |
| V0 reset (SOC 20%) [V] | 12.93 | 13.45 | 13.70 | 14.33 | 14.49 | 14.69 | 14.56 |
| V0 reset (SOC 10%) [V] | 12.51 | 13.09 | 13.36 | 13.83 | 14.08 | 14.41 | 14.33 | where $V_{0\ reset} = V_{0\ ini} - V_{ms}$

TABLE 13

| | Vm * C(SOC) | Vms | | Vm * C(SOC) or Vms |
|---|---|---|---|---|
| SOC65% | 0.55 | 0.56 | → | 0.56 |
| SOC60% | 0.52 | 0.55 | → | 0.55 |
| SOC50% | 0.48 | 0.52 | → | 0.52 |
| SOC40% | 0.44 | 0.49 | → | 0.49 |
| SOC30% | 0.39 | 0.47 | → | 0.47 |
| SOC20% | 0.37 | 0.41 | → | 0.41 |
| SOC10% | 0.35 | 0.29 | → | 0.35 |

Figure 8:
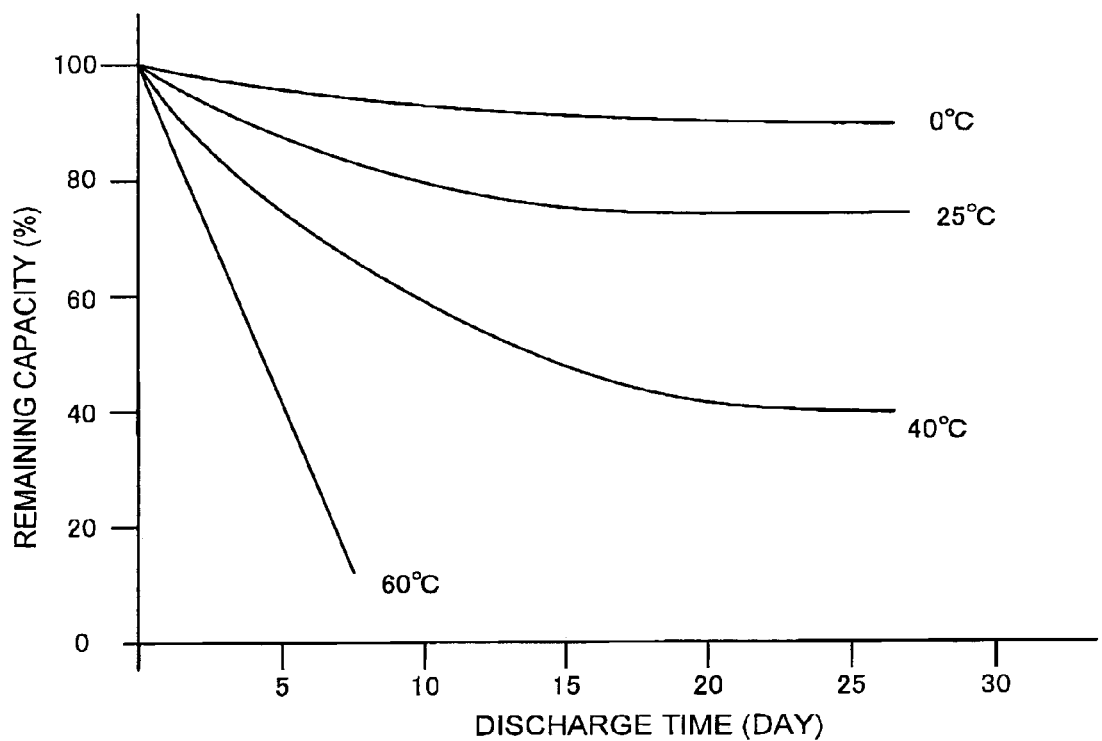
FIG. 8 is a characteristic view showing self discharging characteristics.
Figure 9:
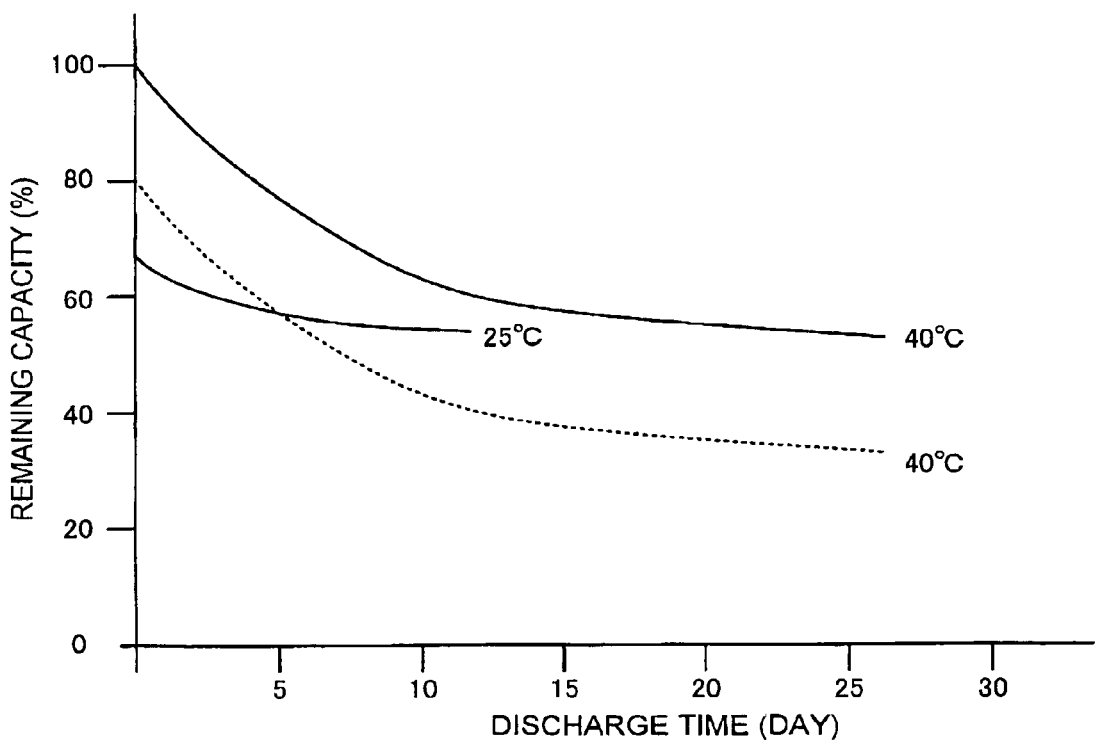
FIG. 9 is a characteristic view showing self discharging characteristics.

A calculation method of self discharging amount used in the example 6 is described as follows. However, other method may be used for calculation of self discharging. Data shown in FIG. 8 represents variation of self discharging characteristics for various temperatures in the case where a rechargeable battery is fully charged. In addition, as shown in FIG. 9, in the case where a rechargeable battery is not fully charged (for example, about 80%), it was found that their self discharging characteristics are the same as shown by a solid line (100% charged) and a dashed line (80% charged) in FIG. 9. In other words, irrespective of charged percentage of rechargeable battery 8, it was found that the self discharging amount of rechargeable battery 2 had substantially the same characteristics. Additionally, in this case, the remaining capacity calculation portion 18 stores variation of nickel-hydrogen battery as the rechargeable battery for elapsed time from start of self discharging as shown in FIG. 8. Accordingly, ΔSOC [AH] (or %) that is reduced capacity for a prescribed time in arbitrary elapsed time fro start [day] is obtained and integrated, thus, self discharging amount can be calculated. For example, to simply explain this calculation, in the case where a battery temperature is 40° C. from start of self discharging to fifth day, and a battery temperature is 25° C. after the fifth day, the self discharging amount is calculated as shown in FIG. 9. That is, the variation curve of remaining capacity at battery temperature of 25° C. is shifted in the vertical direction in parallel to intersect the variation curve of remaining capacity at battery temperature of 40° C. at the fifth by using variation of remaining capacity at battery temperature of 25° C. shown in FIG. 8. The self discharging amount is calculated based on the variation curve of remaining capacity at battery temperature of 40° C. from the start of self discharging to the fifth day, and based on the variation curve of remaining capacity at battery temperature of 25° C. after the fifth day.

A battery remaining capacity detection method and a power supply apparatus according to the present invention can be suitably applied to a high-output, large-current power supply apparatus such as a power supply apparatus for vehicles including hybrid car, electric car, and so on.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims. This application is based on Application No. 2005-8115 filed in Japan on Jan. 14, 2005, the content of which is incorporated hereinto by reference.

What is claimed is:

1. A battery remaining capacity detection method that calculates a remaining capacity of a battery having the possibility that a memory effect occurs by using a correlation between a voltage ($V_0$) and the remaining capacity, the method comprising:

obtaining a correlation between a reset voltage ($V_{o\ reset}$) that is obtained by subtracting a value obtained by multiplying an occurrence amount ($V_m$) based on the memory effect by a memory effect occurrence amount correction value (C(SOC)) from an initial voltage ($V_{o\ ini}$) and the remaining capacity, in the battery after use, based on a correlation between the initial voltage ($V_{o\ ini}$) and the remaining capacity; and obtaining the remaining capacity by setting the voltage ($V_0$) of the battery after use as the reset voltage ($V_{0\ reset}$).

2. The battery remaining capacity detection method according to claim 1, wherein the memory effect occurrence amount correction value (C(SOC)) is a value that correlates to a remaining capacity used in a battery operation state before calculation.

3. The battery remaining capacity detection method according to claim 2, wherein the memory effect occurrence amount correction value (C(SOC)) is controlled such that, in the case where the remaining capacity used in the battery operation state falls within a range where the memory effect is large, it approaches 1, and, in the case where the remaining capacity used in the battery operation state falls within a range where the memory effect is small, it approaches zero.

4. The battery remaining capacity detection method according to claim 1, wherein the occurrence amount ($V_m$) based on the memory effect has a positive correlation with a value obtained by integrating a value obtained by multiplying a charging or discharging current value, a correction coefficient relating to battery deterioration, and a correction coefficient corresponding to a battery temperature at a prescribed period, wherein the correction coefficient corresponding to a battery temperature has a positive correlation with the battery temperature, wherein the correction coefficient relating to battery deterioration is a value that has a positive correlation with a value obtained by integrating a value obtained by multiplying a charging or discharging current value, and a correction coefficient corresponding to a second battery temperature at a prescribed period, wherein the correction coefficient corresponding to a second battery temperature has a positive correlation with the battery temperature.

5. The battery remaining capacity detection method according to claim 1, wherein a value obtained by multiplying the occurrence amount ($V_m$) based on the memory effect in the electromotive ($V_0$) and the memory effect occurrence amount correction value (C(SOC)) is compared with a voltage reduction difference ($V_{ms}$) corresponding to a self discharging amount in the electromotive ($V_O$), when the voltage reduction difference ($V_{ms}$) corresponding to a self discharging amount is larger, a correlation between a second reset voltage ($V_{o\_reset}$) obtained by subtracting the voltage reduction difference ($V_{ms}$) corresponding to a self discharging amount from the initial voltage ($V_{o\_ini}$) and the remaining capacity is obtained, in the battery after use, based on the correlation between the initial voltage ($V_{o\_ini}$) and the remaining capacity, and the remaining capacity is obtained by setting the voltage ($V_o$) of the battery after use as the second rest voltage ($V_{o\_reset}$).

\* \* \* \* \*